(12) United States Patent
Croughwell

(10) Patent No.: US 6,560,305 B1
(45) Date of Patent: May 6, 2003

(54) FREQUENCY DETECTOR

(75) Inventor: Rosamaria Croughwell, Methuen, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/168,369

(22) Filed: Oct. 7, 1998

Related U.S. Application Data

(60) Provisional application No. 60/062,426, filed on Oct. 15, 1997.

(51) Int. Cl.[7] .............................................. H03D 3/24
(52) U.S. Cl. ...................... 375/376; 375/360; 375/374; 331/11; 331/12; 327/147; 327/148; 327/156; 327/157
(58) Field of Search .............................. 375/375, 376, 375/374, 371, 373, 326, 327, 360; 327/12, 147, 148, 156, 157, 236; 331/1 A, 1 R, 11, 12

(56) References Cited

U.S. PATENT DOCUMENTS

| 4,069,462 A | 1/1978 | Dunn ............................ 331/11 |
| 4,222,013 A | 9/1980 | Bowers et al. ............... 331/1 A |
| 4,773,085 A | 9/1988 | Cordell ........................ 375/120 |
| 5,301,196 A | 4/1994 | Ewen et al. .............. 370/105.2 |
| 6,041,090 A * | 3/2000 | Chen ........................... 375/376 |
| 6,081,572 A * | 6/2000 | Filip ........................... 375/376 |
| 6,192,094 B1 * | 2/2001 | Herrmann et al. .......... 375/375 |
| 6,255,858 B1 * | 7/2001 | Akiyama et al. ............. 327/12 |

OTHER PUBLICATIONS

PCT Search Report Dated Feb. 24, 1999.

* cited by examiner

*Primary Examiner*—Shuwang Liu
(74) *Attorney, Agent, or Firm*—Samuels, Gauthier & Stevens, LLP

(57) ABSTRACT

A frequency detection system for producing clock pulses having a frequency equal to the frequency of a stream of binary data. The system includes a voltage controlled oscillator for producing the clock pulses. The frequency of such clock pulses changes in accordance with a control signal. Each one of the clock pulses has four sequential, one-quarter period phases. Adjacent phases are separated by boundaries to divide each clock pulse period into four quadrants. A frequency detector is fed by detected edges of the stream of binary data and the clock pulses for producing the control signal in accordance with the difference in frequency between the frequency of the clock pulses and the frequency of the stream of binary data. A lock-out circuit prevents subsequent production of the control signal until a subsequently detected data edge crosses a different one of the boundaries.

5 Claims, 6 Drawing Sheets

FREQUENCY DETECTOR

CROSS REFERENCE TO RELATED APPLICATIONS

Under 35 USC §119(e) (1), this application claims the benefit of prior U.S. Provisional Application No. 60/062,426, filed Oct. 15, 1997.

BACKGROUND OF THE INVENTION

This invention relates generally to frequency detectors and more particularly to frequency detectors adapted for use in clock recovery circuits which operate at relatively high data rates.

As is known in the art, frequency detectors have a wide range of applications. One application is in a clock recovery circuit. In such circuit, a stream of binary data is fed to the circuit. The clock recovery circuit if effect detects the frequency of the stream of binary data and produces clock pulses synchronized with the stream of binary data. That is, the clock recovery circuit recovers the clock pulses used to generate the stream of binary data.

One such clock recover circuit is described in an article entitled "A 143–360 Mb/s Auto-Rate Selecting Data-Retimer Chip for Serial-Digital Video Signals" by David Poston and Alan Buchholz, published in 1996 IEEE International Solid-State Circuits Conference Paper FP 123.2 pages 196 and 197. The circuit described in this article includes a feedback loop made up of a frequency detector and a voltage controlled oscillator (VCO). The frequency detector is fed by the stream of binary data and the output of the frequency detector and drives the VCO to produce a train of clock pulses having the same frequency of the stream of binary data. The frequency detector then tracks changes in the frequency of the stream of binary data so that the frequency of the clock pulses produced by the VCO the same as the frequency of the stream of binary data (i.e., the clock pulses which produced the binary data is thereby recovered). A phase lock loop (PLL) is also provided. The PLL includes a phase detector which is also fed by the stream of binary data and the clock pulses produced by the VCO. Once the frequency of the stream of binary data is being tracked by the VCO (i.e., the clock pulse frequency is the same as the frequency of the stream of binary data), the PLL adjusts the VCO such that the center of the each binary data is aligned with the rising (or falling) edge of a VCO produced clock pulse. Thus, the stream of binary data is properly time-aligned with the VCO produced clock pulses so that such binary data may be sampled in response to the rising edge (or falling edge) of the VCO clock pulse for further, down-stream processing.

The frequency detector used in the above referenced article operates on the concept of rotational frequency detection. That is, the frequency detector produces an output signal related to the difference between the frequency of the stream of binary data and the frequency of the VCO clock pulses. In general, if there is a frequency error between two signals, their phase relationship will change with time; the rate of change of phase is proportional to the frequency error. The circular diagrams of FIG. 1 are phasor representations of the VCO clock pulses. A ray from the origin rotates counter-clockwise with time at an angular rate $\omega_{VCO}$. The frequency detector operates by taking snapshots or samples of this VCO phasor at the instants of occurrence of data transitions; (i.e., the rising and falling edges of the stream of binary data) the frequency error information is contained in the rate and direction of rotation of these phasor samples over time.

Imagine for analogy a bicycle wheel with a red ribbon tied around one of its pokes, spinning at a constant rate in a dark room. If a strobe light is triggered by an electrical signal at the same frequency as the wheel's rotational rate, the ribbon will appear to be fixed in angular position. If the frequency of the strobe is varied slightly, the ribbon will begin rotating in a direction determined by the polarity of the frequency error, at a rate $\omega_e$ proportional to the magnitude of the error (the number of complete revolutions per second of the ribbon is exactly equal to frequency difference in Hz). In this way edges in the data "strobe" the VCO phasor. Note that each VCO produced clock pulse period is divided into four phases or quadrants, labelled A, B, C, and D in FIG. 1. The frequency detector operates by "watching" the $\omega_e$ phasor as it rotates past the B-C border (i.e., boundary $B_{BC}$) in the phasor diagram. For example, if a data transition is detected in B, then C, the detector outputs a "pump-down" pulse, reflecting the fact the data rate is lower than the VCO frequency; conversely, if a transition is detected in C, then B, the frequency of the data is higher than that of the clock pulses, and a "pump-up" pulse is generated. This method is feasible so long as the frequency difference is such that the change is angular position of the ribbon is less than half a revolution on consecutive strobe flashes ($|\omega_e|<50\%$ of $\omega_{data}$).

The process of frequency detection is complicated by the fact that the data at the input is random; a data transition may or may not occur in a given data period. Returning to the bicycle wheel analogy, the strobe is intermittent, flashing (on average) half the time. One might image that, for small enough frequency differences, it would still be possible to determine the apparent angular velocity $\omega_e$ (magnitude and direction) of the strobe ribbon. It is may be shown that the range of the frequency detector is in excess of ±25% of $\omega_{data}$ with random data.

After phase acquisition, a phase lock loop (PLL) maintains coincidence between the. data transitions and the rising edge of the clock pulse (the A-D boundary, $B_{AD}$ in the phasor diagram). The frequency detector senses rotation at the boundary between the quadrants B and C, (i.e., boundary $B_{BC}$) so that it is inactive after phase-lock is achieved. Jitter on either side the clock pulses or the data can conceivably trigger the frequency detector, this would require a jitter event of greater than 90 degrees (causing a data transition to occur in quadrant B or C), followed by a jitter even of greater than 180 degrees (or >90 degrees in the opposite direction). In the even of such an occurrence, the resulting error pulse must not have enough gain to throw the PLL out of lock.

The specific frequency detector described in the above referenced article includes a series of "D" flip-flops having their "D" input fed by the VCO clock pulses ("in-phase" and "quadrature" clock pulses) and enabled by detected edges of the stream of binary data. The outputs of the flip-flops are fed to a combinational logic (i.e., UP/DN Decoder). The combinational logic produced a pair of control signals each time the B-C boundary, $B_{BC}$, is crossed; one control signal to cause a charge pump to "pump-up" and increase the VCO clock frequency and control signal to cause the charge pump to "pump-down" and decrease the VCO clock frequency. The pair of control signals is fed to an OR gate of a decoder lock-out circuit. Thus, the OR gate produces a control signal each time B-C boundary, $B_{BC}$, is crossed. The lock-out circuit includes a latch fed by the output of the OR gate and one of the flip-flops. Such one of the flip-flops indicates when the data vector is in the left hand plane (i.e., quadrants B or C). The decoder lock-out circuit prevents multiple "pump-up"/"pump-down" pulses from being produced as a result of jittering across the B-C boundary, $B_{BC}$, during low slip rates (i.e., low frequency differences).

While such frequency detector circuit works for data rates in the range of 143–360 Mb/s, in some application clock recovery circuits are required to operate with data rates in the order of 600 MHz.

SUMMARY OF THE INVENTION

In accordance with the present invention, a frequency detection system is provided for producing clock pulses having a frequency equal to the frequency of a stream of binary data. The system includes a voltage controlled oscillator for producing the clock pulses. The frequency of such clock pulses changes in accordance with a control signal. Each period of the clock has four sequential, one-quarter period phases. Adjacent phases are separated by boundaries to divide each clock pulse period into four quadrants. A frequency detector is fed by detected edges of the stream of binary data and the clock pulses for producing the control signal in accordance with the difference in frequency between the frequency of the clock and the frequency of the stream of binary data. The frequency detector includes a pair of clock pulse/detected data edge latches fed by the clock pulses and the detected edges of the stream of binary data. One of such latches stores a binary signal indicating when a detected edge occurs during a first quadrant and another one of latches produces a binary signal indicating when a detected edge occurs during a second quadrant contiguous to the first quadrant of the clock. A network, fed by the clock pulse/detected data edge latches, the clock pulses produced by the voltage controlled oscillator, and a "block"/"unblock" control signal, is adapted to produce the control signal when detected data edges crosses the boundary between the first and second quadrants and when the "block"/"unblock" control signal is an "unblock" condition. A lock-out circuit produces the "block"/"unblock" control signal to place the network in the "block" condition subsequent production of the control signal and to maintain such "block" condition until a subsequently detected data edge crosses a different one of the boundaries to thereby place the network in the "unblock" condition.

BRIEF DESCRIPTION OF THE DRAWING

These and other features of the invention will become more readily apparent from the following detailed description taken with the accompanying drawings, in which.

DESCRIPTION OF THE PREFERRED EMBODIMENTS

Figure 2:
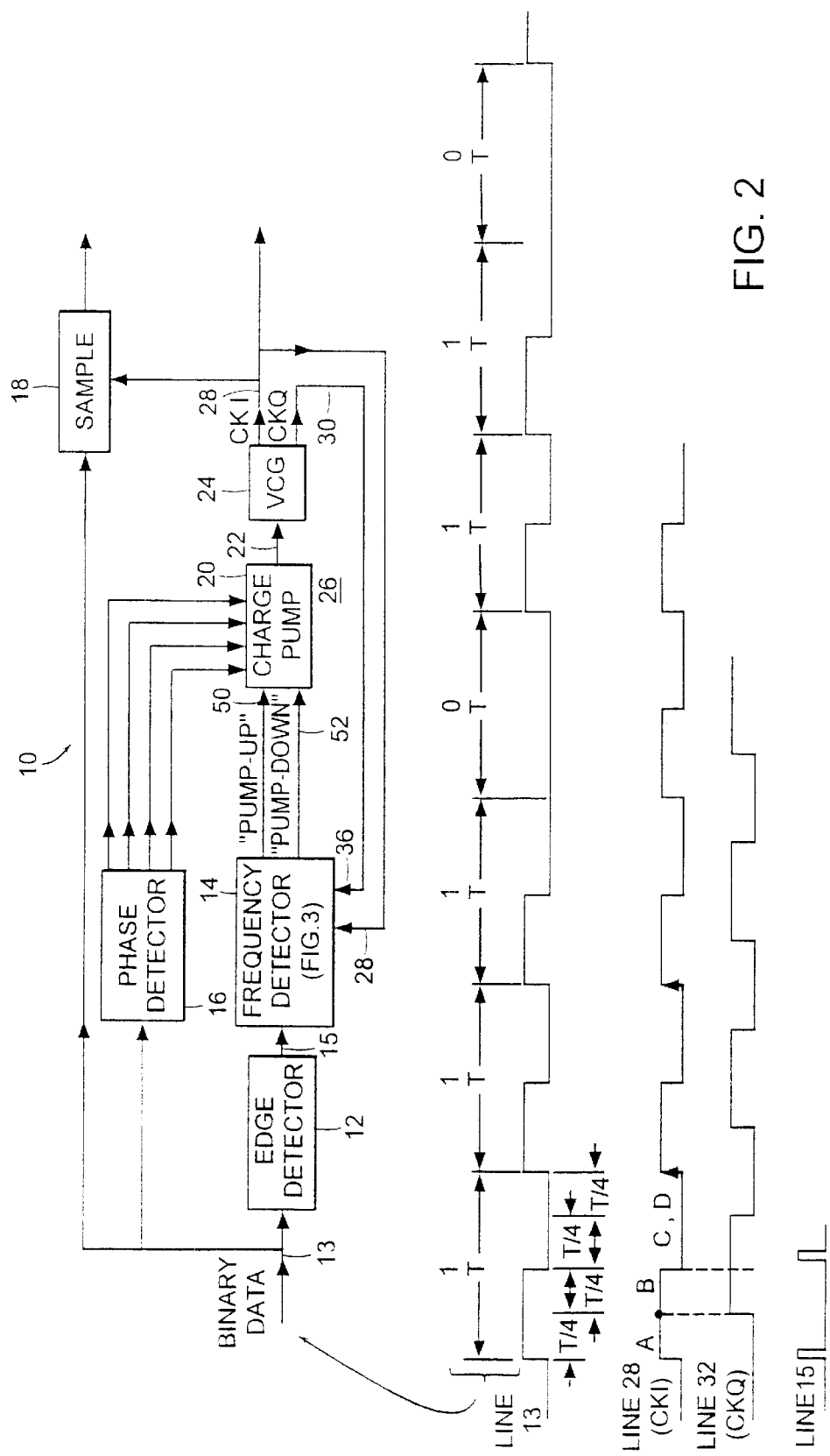
FIG. 2 is a block diagram of a clock recovery circuit having a frequency detector according to the invention.

Referring how to FIG. 2, a clock recovery circuit 10 is shown to include an edge detector ed by a stream of binary data on line 3 for producing a pulse in response to the rising edge and falling edge of the stream of binary data on line 15. The output of the edge detector 12 is fed to a frequency detector 14 to be described in detail in connection with FIG. 3, a phase detector, and a sampler 18. The outputs of the phase detector 16 and the frequency detector 14 are fed to a charge pump 20. The charge pump 20 provides a control signal on line 22 to a voltage controlled oscillator (VCO) 24. The frequency detector 14, charge pump 12 and VCO 24 provide a feedback, frequency detection system 26 enabling the voltage controlled oscillator 24 to produce in-phase and quadrature clock pulses, CKI, CKQ, on lines 28, 30, respectively, having a frequency equal to the frequency of a stream of binary data on line 13. Once the voltage controlled oscillator 24 produces clock pulses on lines 28, 30, having a frequency equal to the frequency of a stream of binary data on line 13, a phase lock loop (PLL) provided by the phase detector 16, charge pump 20, and VCO 24 causes the phase detector 16 to drive the charge pump 20 to control the phase of the clock pulses produced by the VCO 24 on lines 28, 30 such that the rising edge of the produced clock pulses on line 28 are time coincident with the center of the binary data bits on line 13. In this way the sampler 18, which is fed both the binary data on line 13 and the clock pulses on line 28 can effectively sample each one of the binary data bits on line 13 in the stream of binary data on line 13. Here, the phase detector 16 adjusts the phase of the clock pulses on line 28 such that the rising edge thereof occurs in the center of each binary data bit.

Considering first the frequency detection system 26, as noted above such system 26 includes: the frequency detector 14, the charge pump 20; and the voltage controlled oscillator 24, for producing in-phase clock pulses, CKI, and quadrature clock pulses, CKQ, on lines 28, 30 respectively, as shown in FIG. 2. It is noted that the quadrature clock pulses CKQ on line 30 are delayed (shifted) in time from the in-phase clock pulses CKI on line 28 by one quarter of a clock pulse period, T. Each clock period is separated into four sequential phases, or quadrants, A, B, C, and D as described above in connection with FIG. 1. A first one of the phases (A) occurs when the in-phase clock pulses (CKI) are at a first state (e.g. logic 1) and the quadrature clock pulses CKQ are in a second state and the quadrature clock pulses are in the first state. And, the fourth phase (D) occurs when the in-phase clock pulses are in the second state and the quadrature clock are in the second state. The first, second, third, and fourth phases A, B, C, and D are separated by first, second, third, and fourth boundaries $B_{AB}$, $B_{BC}$, $B_{CD}$, and $B_{AD}$, respectively, to provide four quadrants, A, B, C, and D shown and described above in connection with FIG. 1. The VCO 24 clock pulses CKI and CKQ have a frequency which changes in accordance with an output signal produced by the charge pump 20 on line 22. The frequency detector 14 is fed by: (1) the rising and falling edges of the stream of binary data on line 13 detected by the edge detector 12; and (2) by the in-phase and quadrature clock pulses produced by the VCO 24 on lines 28 and 30. In the steady state, the frequency detection system 26 produces clock pulses on lines 28, 30 having a frequency equal to the frequency of a stream of binary data.

Figure 3:
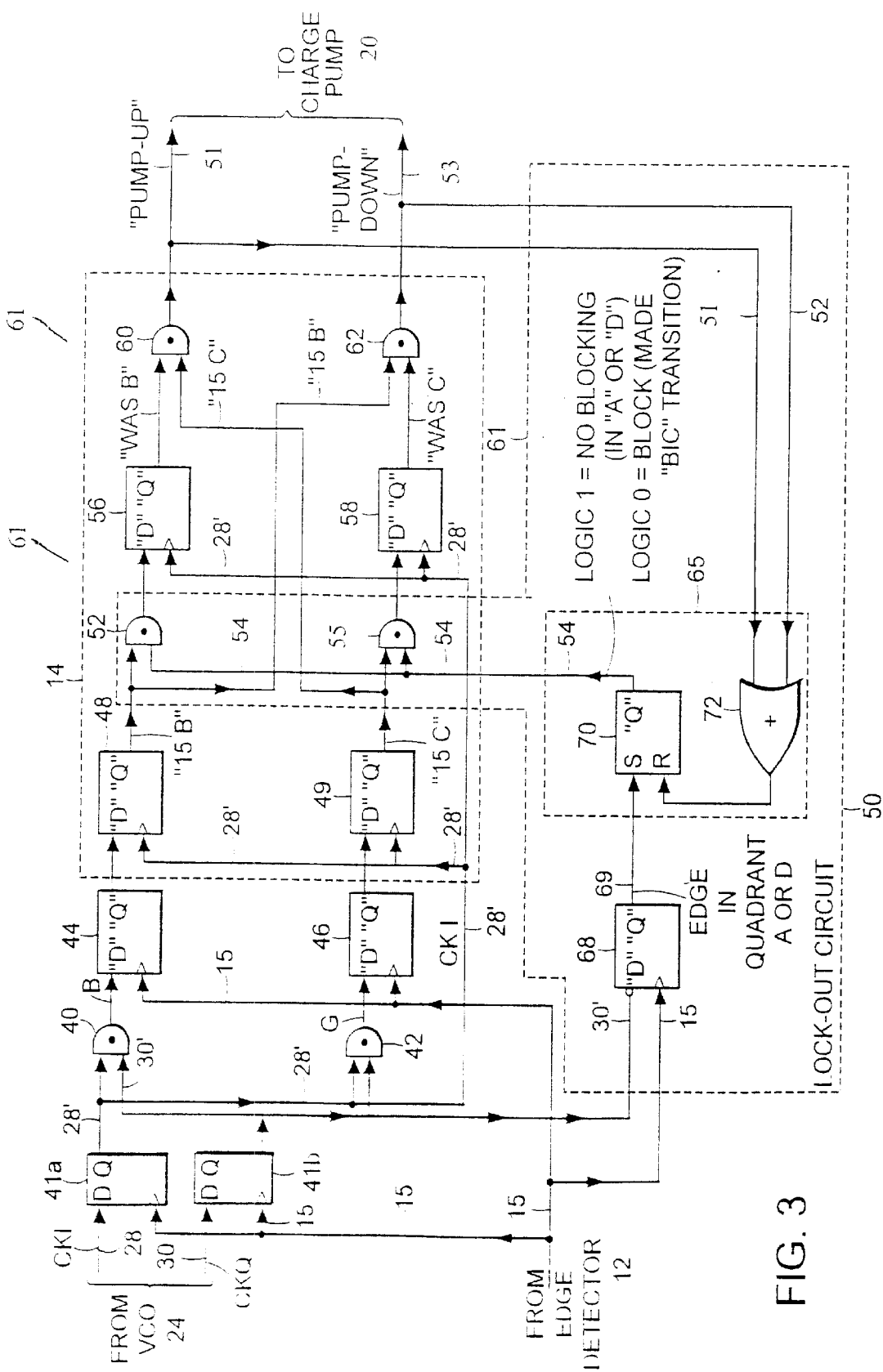
FIG. 3 is a block diagram of the frequency detector used in the clock recovery circuit of FIG. 2.

Referring now to FIG. 3, the frequency detector 14 is shown in more detail to include: a pair of AND gates 40, 42 fed by a pair of latches 41a, 41b, respectively, as shown. The D inputs of the pair of latches 41a, 41b are fed by the in-phase and quadrature clock pulses CKI, CKQ, respectively, produced by the VCO 24 (FIG. 2) on lines 28, 30, respectively and by the output of edge detector 12 on line 15. AND gate 40 is fed by the latched in-phase and quadrature clock pulses CKI, CKQ, produced by the latches 41a, 41b on lines 28', 30', respectively. Thus, in response to the rising edge and falling edge of the stream of binary data on line 15, the output of AND gate 40 is a logic 1 when the latched clock pulses CKI on line 28' are in the second phase, B, and the output of AND gate 40 is a logic 0 when the latched clock pulses CKI on line 28' are in phases A, C, and D. AND gate 42 is fed by the latched in-phase and quadrature clock pulses CKI, CKQ, produced by the latches 41a, 41b on lines 28', 30', respectively; however, the pulses on line 28' are fed to an inverting input of AND gate 42. Thus, the output of AND gate 42 is a logic 1 when the latched clock pulses on line 28' are in the third phase, C, and the output of AND gate 40 is a logic 0 when the latched clock pulses on line 28' are in phases A, B, and D.

The outputs of AND gates 40, 42 are fed to the "D" inputs of clock pulse/detected data edge latches 44, 46, respectively, as shown. The latch inputs of latches 44, 46 are fed by the detected edges of the stream of binary data on line 15 (FIG. 2) produced by the edge detector 12 (FIG. 2). That is, the edge detector 12 produces a pulse on line 15 in response to a rising edge and a falling edge of the binary data on line 13. Latch 44 stores a binary signal (here, logic 1) when a detected binary data edge occurs during phase B of the clock pulses on line 15 and latch 46 produces a binary signal (here, logic 1) when a detected binary data edge occurs during the sequential phase C.

The frequency detector 14 includes a pair of D flip-flops 48, 49. The "D" inputs of D flip-flops 48, 49 are fed by the "Q" outputs of latches 44, 46, respectively, as shown. The latch inputs of D flip-flops 48, 49 are fed by the in-phase clock pulses CKI produced by VCO 24 after being latched in latch 41a (i.e., the pulses on line 28'). The binary signal stored in the latch 44 is shifted to D flip-flop 48 in response to the rising edge each one of the latched in-phase clock pulses CKI fed thereto on line 28', and the binary signal stored in the latch 46 is shifted to D flip-flop 49 in response to the rising edge of the latched in-phase clock pulses CKI fed thereto on line 28'. Thus, D flip-flop 48 produces a logic 1 at the "Q" output thereof when an edge of the binary data occurs when a latched in-phase clock pulse CKI is in phase (or quadrant) B (i.e., an "IS B" signal) and D flip-flop 49 produces a logic 1 at the "Q" output thereof when an edge of the binary data occurs when a latched in-phase clock pulse CKI is in phase (or quadrant) C (i.e., an "IS C" signal.

The frequency detector 14 includes a lock-out circuit 50. The lock-out circuit 50 includes a pair of gates, here AND gates 52, 55, coupled to "D" outputs of the D flip-flops 48, 49, respectively, and to a block/unblock control signal produced on line 54. The block/unblock control signal on line 54 is in an "unblock" condition (i.e.,;logic 1 state) when a detected binary data edge occurs during phases A or D of the latched in-phase clock pulses on line 28' and is in a "block" condition (i.e., logic 0) when a pair of successive detected binary data edges occur in the phases B and C.

The frequency detector 14 includes a second pair of D flip-flops 56, 58. The "D" inputs of the D flip-flops 56, 58 are fed by the pair of AND gates 52, 55, respectively, as shown. The latch input of each one of the second pair of D flip-flops 56, 58 is fed and by the latched in-phase clock pulses CKI produced by the voltage controlled oscillator 24 on line 28'.

Thus, when the lock-out circut 50 is in the "unblock" condition, the binary signal stored in D flip-flop 48 is shifted to D flip-flop 56 one in-phase clock pulse later in response to the rising edge of the latched in-phase clock pulse CKI fed thereto and the binary signal stored in D flip-flop 49 is shifted to D flip-flop 58 one latched in-phase clock pulse later in response to the rising edge of the latched in-phase clock pulse CKI fed thereto. Thus, a logic I at the "Q" output of D flip-flop 56 indicates that an edge of the binary data was, during the previous latched in-phase clock pulse on line 28', in phase (or quadrant) B (i.e., "WAS B") and a logic 1 at the Q output of D flip-flop 58 indicates that an edge of the binary data was, during the previous latched in-phase clock pulse on line 28', in phase (or quadrant) C (i.e., "WAS C"). During a "block" condition on line 54, the binary data stored in either D flip-flop 48 or 49 is inhibited from being shifted to D flip-flops 56 and 59 by the AND gates 52, 55, respectively, of the lock-out 50.

The frequency detector 14 includes a pair of gates, here AND gates 60, 62. AND gate 60 is fed by the "WAS B" and "IS C" signals produced at the "Q" outputs of D flip-flops 56, 49, respectively. AND gate 62 is fed by the "IS B" and "WAS C" signals produced at the "Q" outputs of D flip-flops 48, 58, respectively. Thus, in an "unblocked" condition, AND gate 60 produces a logic 1 when a binary data detected edge occurred during phase B of the latched in-phase clock CKI and after a latched in-phase clock CKI occurs during phase C of the in-phase clock. That is, the AND gate 60 produces a logic 1, "pump-up" control signal on line 51 for the charge pump 20 when the detected binary data edges go from boundary B to boundary C; i.e., crosses the boundary $B_{BC}$. Likewise, in an "unblocked" condition, AND gate 62 produces a logic 1 when a binary data detected edge occurred during phase C of the latched in-phase clock CKI and after a latched in-phase clock CKI occurs during phase B of the latched in-phase clock. That is, the AND gate 62 produces a logic 1, "pump-up" control signal on line 52 for the charge pump 20 when the detected binary data edges go from boundary C to boundary B; i.e., crosses the boundary $B_{BC}$. Thus, in the "unblocked" condition, a logic 1 is produced on either line 51 or 53 when a detected binary data edge crosses the boundary between the phase, or quadrant B and phase, or quadrant C, i.e., when the boundary $B_{BC}$ is crossed.

Referring again to the lock-out circuit 50, such lock-out circuit 50 includes a latch 68 having an inverting "D" input fed by the latched quadrature phase clock pulses CKQ on line 30' and a latch input fed by binary data detected edges on line 15. A logic 1 is thus stored in latch 68 when a detected binary data edge occurs when the latched in-phase clock pulse CKI on line 28' is in either phase A or phase D. The logic 1 produced at the "Q" output of latch 68 on line 69 is used to trigger an SR latch 70 of the lock-out circuit 50 to a SET condition. When in the SET condition, the "Q" output of the SR latch 70 produces a logic 1 on line 54 placing the lock-out circuit 50 in the "unblock" condition. The lock-out circuit 50 includes an OR gate 72 fed by the "pump-up" and "pump-down" signals on lines 51, 53, respectively. As noted above, in the "unblocked" condition, a logic 1 is produced on either line 51 or 53 when a detected binary data edge crosses the boundary between the phase, or quadrant B and phase, or quadrant C; i.e., crosses the boundary $B_{BC}$. The output of OR gate 72 is fed to the RESET input of SR latch 70. Thus, when a detected binary data edge crosses the boundary $B_{BC}$ between the phase, or quadrant B and phase, or quadrant C, the SR latch 70 places the lock-out circuit 50 in the "block" condition until a detected binary data edge again SETS the SR latch 70 and thereby places the lock-out circuit 50 in the "unblock" condition.

Thus, the frequency detector 14 is adapted to produce "pump-up" and "pump-down" control signal on lines 51, 53 respectively for the charge pump 20 (FIG. 2) when detected binary data edges cross the boundary BBc between phase (or quadrant) B and the contiguous phase (or quadrant) C (FIG. 1) and the lock-out circuit 50 prevents subsequent production of either a "pump-up" or "pump-down" control signal on line 51 or 53 until a subsequently detected data edge crosses a different one of the boundaries (here crosses the boundary $B_{AD}$ between phase (or quadrant) A and phase (or quadrant) D.

Thus, a network 61 is provided which includes D flip-flops 48, 49, 56 and 58. The network 61 is fed by the clock pulse/detected data edge latches 44, 46, the latched in-phase clock pulses CKI produced on line 28', and the "block"/"unblock" control signal produced by the lock-out circuit 50 on line 54. The network 61 is adapted to produce the "pump-up" or "pump-down" control signals on lines 51, 53, respectively, when detected data edges crosses the boundary $B_{AC}$ and when the "block"/"unblock" control signal on line 54 is an "unblock" condition. The lock-out circuit 50 produces the "block"/"unblock" control signal on line 54 to place the network 61 in the "block" condition subsequent production of either a "pump-up" control signal on line 51 or a "pump-down" control signal on line 53 to maintain such "block" condition until a subsequently detected data edge crosses a different one of the boundaries, here boundary $B_{AD}$ to thereby place the network 61 in the "unblock" condition.

Figure 1:
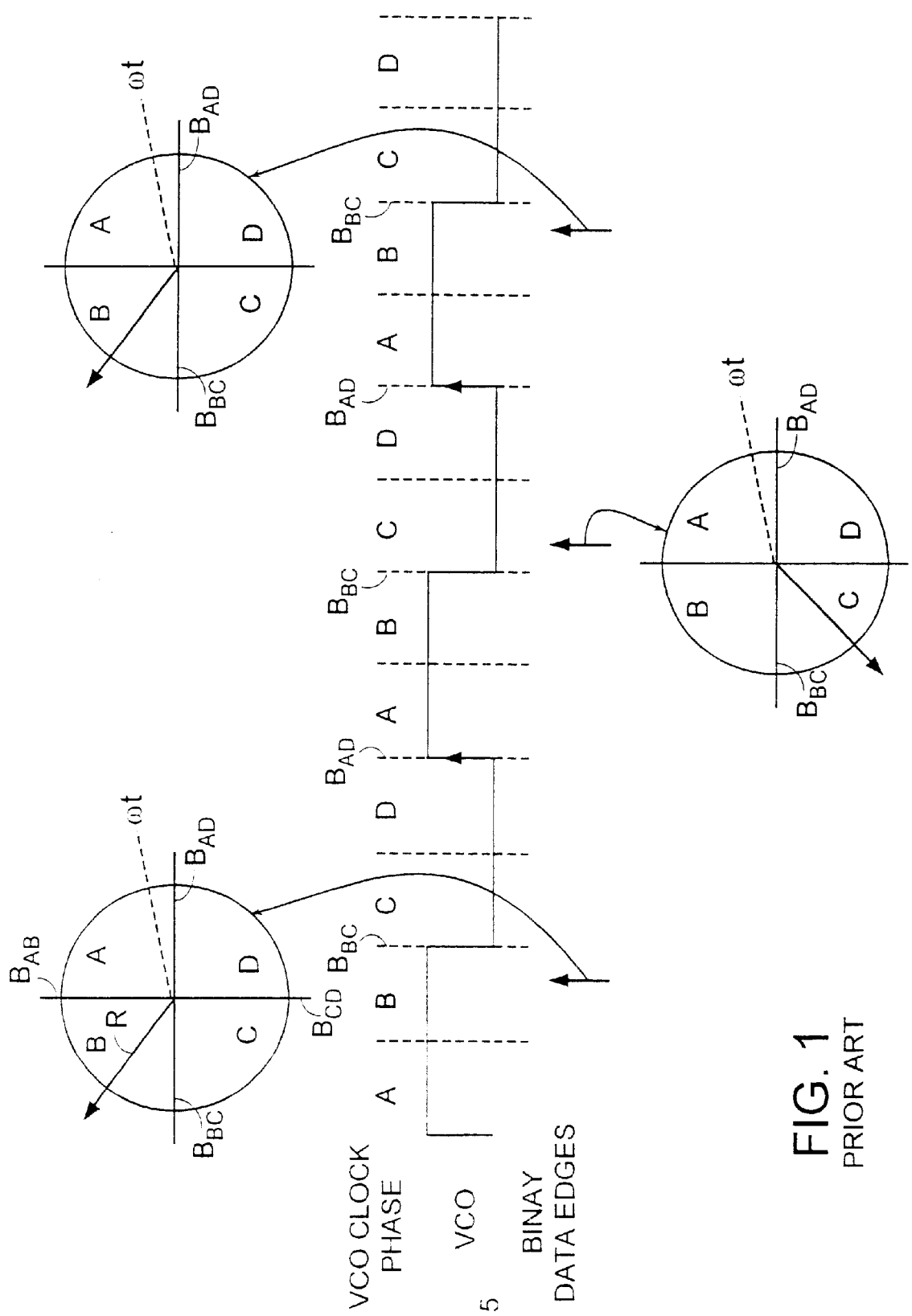
FIG. 1 is a phasor diagram useful in understanding a rotational frequency detector according to the PRIOR ART.

Once the frequency detector 14 tracks the frequency of the stream of data on line 13 (FIG. 1), the PLL shifts the phase of the clock pulses on line 28, 30 as described above, for effective sampling by the sampler 18 (FIG. 1).

Figure 4A:
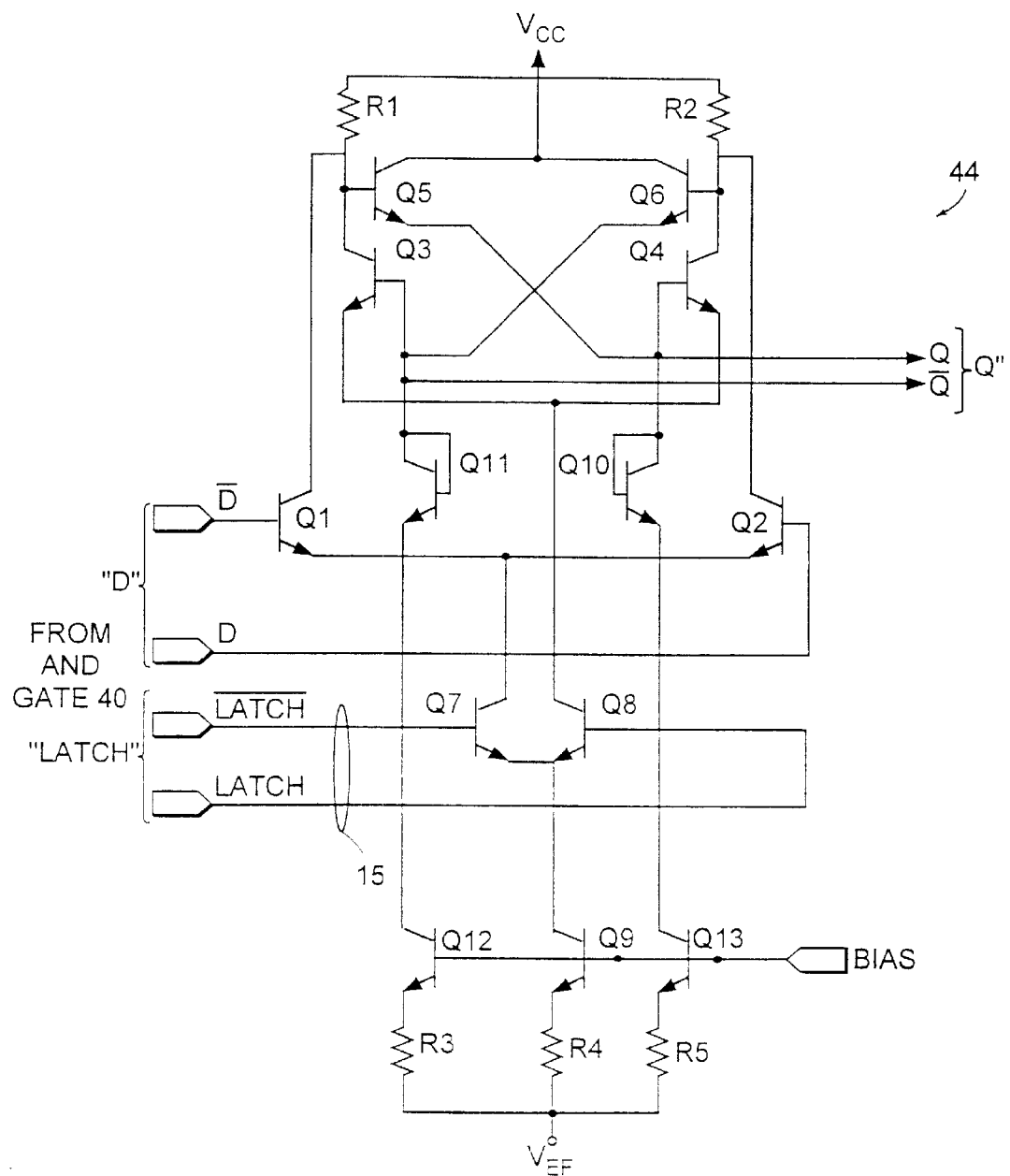
FIG. 4A is a schematic diagram of a latch circuit adapted for use in the frequency detector of FIG. 3.

Referring now to FIG. 4A, a schematic diagram is shown of an exemplary one of the latches 41a, 41b, 44, 46, and 68, here latch 44. The latch 44 includes bipolar transistors $Q_1$—$Q_{13}$, and resistors R1 and R2, arranged and connected to VCC and VEE, as shown. It is noted that differential signals are used; i.e., the signal to the "D" input from AND gate 40 (i.e., B) is a differential signal, the signal to the "LATCH" input on line 15 (i.e., a pair of lines) is a differential signal, and the "Q" output fed to D flip-flop 48 is a differential signal. A bias voltage is fed to the base electrodes of transistors $Q_{12}$, $Q_9$, and $Q_{13}$, as shown.

Figure 4B:
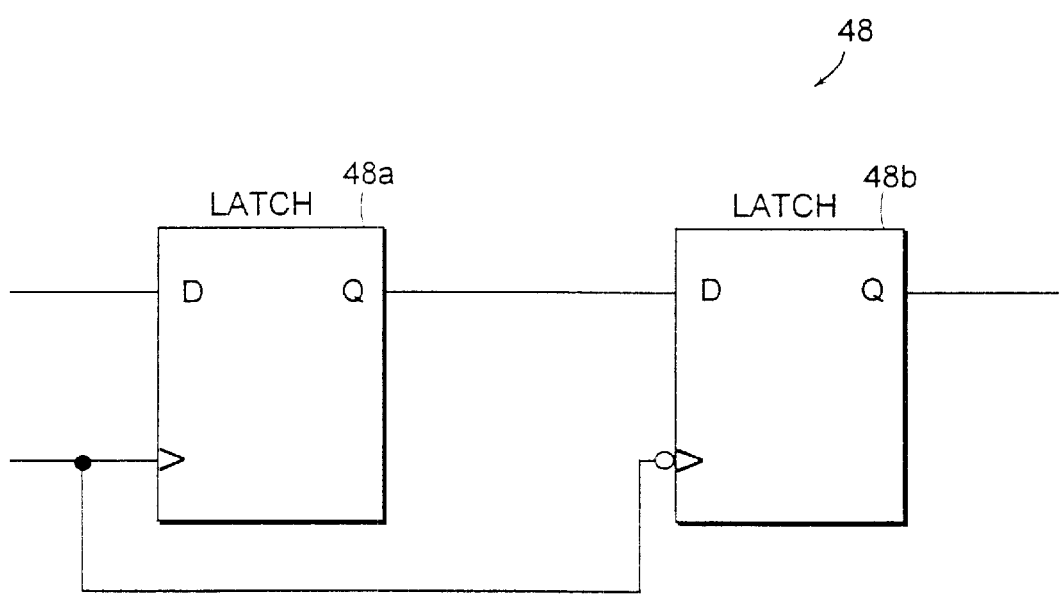
FIG. 4B shows a pair of the latch circuits of FIG. 4A interconnected to provide a D flip-flop circuit used in the frequency detector of FIG. 3; and, FIG. 5 is a schematic diagram of a portion of a lock-out circuit adapted for use in the frequency detector of FIG. 3.

Referring now to FIG. 4B, an exemplary one of the D flip-flops 48, 49, 56 and 58, here D flip-flop 48 is shown to include a pair of the latches shown in FIG. 4A. Thus, a first latch 48a has its D input fed by AND gate 52 and latch 48b has its D input fed by the Q output of latch 48a, as shown. The latch inputs of latches 48a, 48b are fed by the signal on line 28, as indicated.

Figure 5:
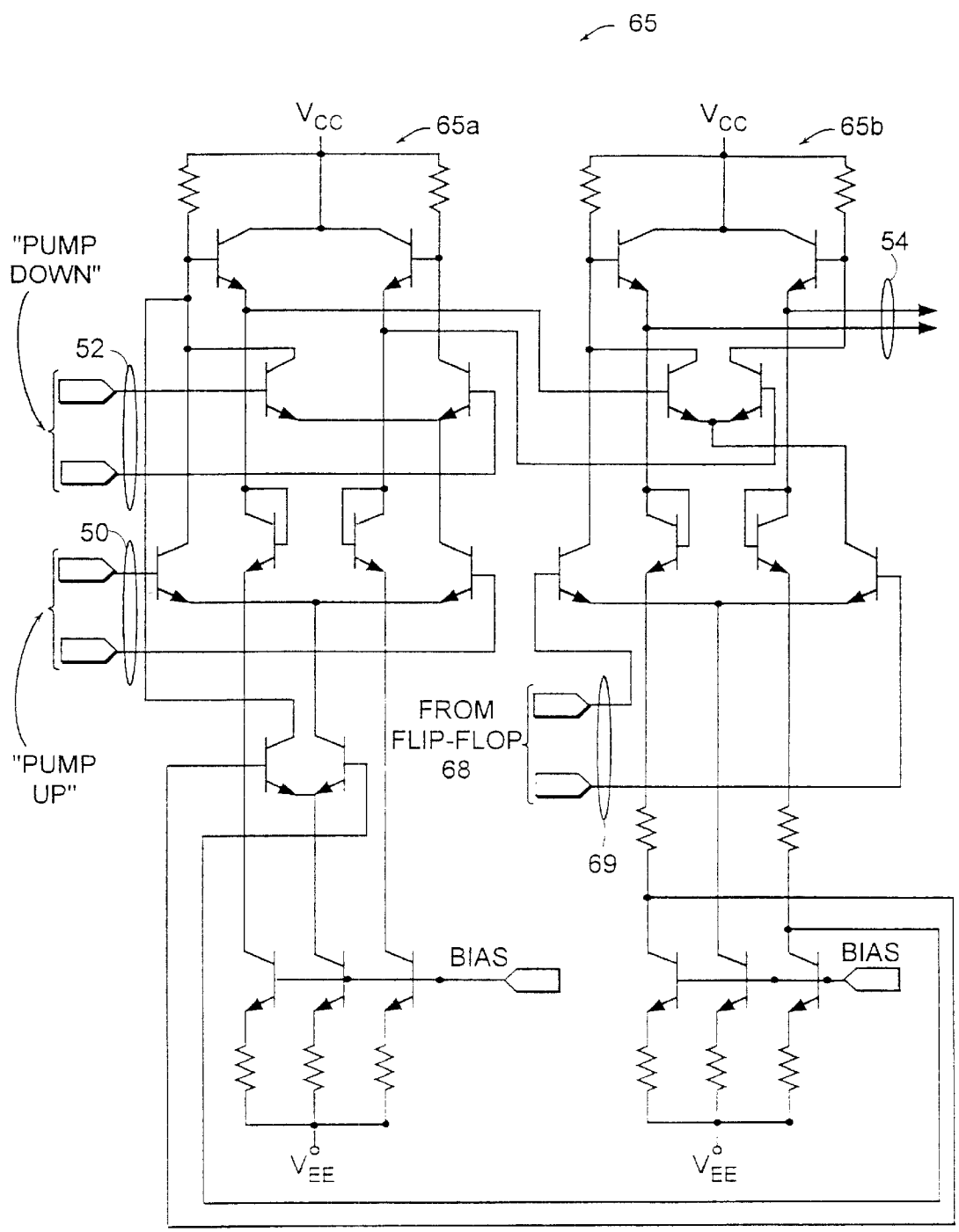

Referring to FIG. 5, a schematic diagram is shown of portion 65 of the lock-out circuit 50 (FIG. 3). Thus the circuit 65 shown in FIG. 5 performs the function of the SR latch 70 and the OR gate 72. The circuit 65 includes a pair of gates 65a, 65b arranged as shown. Gate 65a is fed by the "pump-down" signal (i.e., a differential signal) on line 52 (i.e., a pair of lines) and the "pump-up" signal on line 50 (i.e., a pair of lines). The output of gate 65a provides one differential input to gate 65b, as shown. The other differential input to gate 65b is from flip-flop 68 (i.e., the differential signal on pair of lines 69). The differential output in pair of lines 54 are fed to AND gates 54 and 54 (FIG. 3). As noted above, the differential signal on lines 54 represent a "no blocking" condition, i.e., logic 1 or a "block" condition i.e., logic 0.

Other embodiments are within the spirit and scope of the appended claims.

What is claimed is:

1. A frequency detection system for producing clock pulses having a frequency equal to the frequency of a stream of binary data, comprising:
   (A) a voltage controlled oscillator for producing the clock pulses, the frequency of such clock pulses changing in accordance with a control signal, each one of the clock pulses having four sequential, one-quarter period phases, adjacent phases being separated by boundaries;
   (B) a frequency detector fed by detected edges of the stream of binary data and the clock pulses for producing the control signal in accordance with the difference in frequency between the frequency of the clock pulses and the frequency of the stream of binary data, such frequency detector comprising:
       (i) a pair of clock pulse/detected data edge latches fed by the clock pulses and the detected edges of the stream of binary data, one of such latches storing a binary signal indicating when a detected edge occurs during one of a first pair of sequential phases of the four phases of the clock pulse and another one of latches producing a binary signal indicating when a detected edge occurs during the other one of the first pair of sequential phases of the four phases of the clock pulse;
       (ii) a network, fed by the clock pulse/detected data edge latches, the clock pulses produced by the voltage controlled oscillator, and a block/unblock control signal, adapted to produce the control signal when a detected edge crosses the boundary between first and second quadrants and when the block/unblock control signal is in an unblock condition;
       (iii) a lock-out circuit adapted to produce the block/unblock control signal to place the network in a block condition to prevent subsequent production of the control signal and to maintain such block condition until a subsequently detected edge crosses a different one of the boundaries to thereby place the network in the unblock condition.

2. A frequency detection system for producing clock pulse having a frequency equal to the frequency of a stream of binary data, comprising:
   (A) a voltage controlled oscillator for producing the clock pulses, the frequency of such clock pulses changing in accordance with a control signal, each one of the clock pulses having four sequential, one-quarter period phases;
   (B) a frequency detector fed by detected edges of the stream of binary data and the clock pulses for producing the control signal in accordance with the difference in frequency between the frequency of the clock pulses and the frequency of the stream of binary data, such frequency detector comprising:
       (i) a pair of clock pulse/detected data edge latches fed by the clock pulses and the detected edges of the stream of binary data, one of such latches storing a binary signal indicating when a detected edge occurs during one of a first pair of sequential phases of the four phases of the clock pulse and another one of latches producing a binary signal indicating when a detected edge occurs during the other one of the first pair of sequential phases of the four phases of the clock pulse;
       (ii) a plurality of boundary crossing detection flip-flops, fed by the clock pulse/detected data edge latches and by the clock pulses produced by the voltage controlled oscillator, adapted to produce the control signal to change the frequency of the clock pulses produced by the voltage controlled oscillator, such control signal being produced when one of the detected edges is in one of the first pair of sequential phases of the four phases of the clock pulse during one of the clock pulses and is in the other one of the first pair of sequential phases of the four phases of the clock pulse during a succeeding one of the clock pulses;

(iii) a lock-out circuit for preventing subsequent production of the control signal until a subsequently detected data edge occurs during a second, different pair of the sequential phases of the clock pulse.

3. A frequency detection system for producing clock pulses having a frequency equal to the frequency of a stream of binary data, comprising:

(A) a voltage controlled oscillator for producing the clock pulses, the frequency of the clock pulses changing in accordance with a control signal, each one of the clock pulses having four sequential, one-quarter period phases;

(B) a frequency detector fed by detected edges of the stream of binary data and the clock pulses for producing the control signal in accordance with the difference in frequency between the clock pulses and the stream of binary data, such frequency detector comprising:

(i) a pair of latches fed by the clock pulses and the detected edges of the stream of binary data, one of such latches storing a binary signal indicating when a detected edge occurs during one of a first pair of sequential phases of the four phases of the clock pulse and another one of latches producing a binary signal indicating when a detected edge occurs during the other one of the first pair of sequential phases of the four phases of the clock pulse;

(ii) a first pair of flip-flops, each one being fed by a corresponding one of the pair of latches and by the clock pulses produced by the voltage controlled oscillator, one of the first pair of flip-flops shifting the binary signal stored in the one of the pair of latches fed thereto in response to one of the edges of each one of the clock pulses, another one of the first pair of flip-flops shifting the binary signal stored in the another one of the pair of latches fed thereto in response to one of the edges of each one of the clock pulses;

(iii) a lock-out circuit for preventing subsequent production of the control signal until a subsequently detected edge occurs during a second, different pair of the sequential phases of the four phases of the clock pulse, such lock-out circuit comprising a pair of gates coupled to outputs of the pair of latches and responsive to a block/unblock control signal, such block/unblock control signal being in an unblock condition when a detected edge occurs during the second, different pair of the sequential phases of the four phases of the clock pulse and for producing a block condition when a pair of successive detected edges occur in the first pair of sequential phases of the clock pulses;

(iv) a second pair of flip-flops fed by the pair of gates, each one of the second pair of flip-flops being fed by a corresponding one of the first pair of flip-flops and by the clock pulses produced by the voltage controlled oscillator, one of the second pair of flip-flops shifting the binary signal stored in one of the first pair of flip-flops fed thereto in response to one of the edges of each one of the clock pulses, during the unblock condition and being inhibited from such shifting by the lock-out circuit during the block condition, another one of the second pair of flip-flops shifts the binary signal stored in another one of the first pair of flip-flops fed thereto in response to one of the edges of each one of the clock pulses during the unblock condition and being inhibited from such shifting by the lock-out circuit during the block condition;

and wherein the outputs of the second pair of flip-flops are used to generate the control signal to the voltage controlled oscillator.

4. A frequency detection system for producing clock pulses having a frequency equal to the frequency of a stream of binary data, comprising:

(A) a voltage controlled oscillator, for producing an in-phase clock pulse, CKI, and a quadrature clock pulse, CKQ, shifted in time from the in-phase clock pulse one quarter of a clock pulse period, each clock pulse period being separated into four sequential phases, a first phase occurring when the in-phase clock pulse is at a first state and the quadrature clock pulse is in a second state, a second phase occurring when the in-phase clock pulse is in the first state and the quadrature clock pulse is in the first state, a third phase occurring when the in-phase clock pulse is in the second state and the quadrature clock pulse is in the first state, and a fourth phase occurring when the in-phase clock pulse is in the second state and the quadrature clock pulse is in the second state, the first, second, third and fourth phases being separated by first, second, third and fourth boundaries, respectively, the clock pulses, CKI and CKQ, having a frequency which changes in accordance with a control signal;

(B) a frequency detector fed by detected edges of the stream of binary data and the clock pulses for producing the control signal in accordance with the difference in frequency between the frequency of the clock pulses and the frequency of the stream of binary data such frequency detector comprising:

(i) a first pair of logic gates fed by the in-phase and quadrature clock pulses, one of such gates producing a logic signal having a logic state indicating when a detected edge occurs during one of a first pair of sequential phases of the four phases of the clock pulses and another one of the first pair of logic gates producing a logic signal having the logic state indicating when a detected edge occurs during the other one of the first pair of sequential phases of the four phasesof the clock pulses the first pair of sequential phases of the four phases of the clock pulses occurring when one of the in-phase and quadrature clock pulses is in the first state and the other one of the in-phase and quadrature clock pulses is in the second state during one portion of the clock pulse period and changes the logic state during a succeeding portion of the clock pulse period;

(ii) a pair of latches, each one thereof being fed by a corresponding one of the first pair of gates and the detected edges of the stream of binary data, one of such latches storing a binary signal indicating when a detected edge occurs during one of the first pair of sequential phases of the four phases of a the clock pulses and another one of latches producing a binary signal indicating when a detected edge occurs during the other one of the first pair of sequential phases of the four phases of the clock pulses;

(iii) a first pair of flip-flops, each one being fed by a corresponding one of the pair of latches and by the clock pulses produced by the voltage controlled oscillator, one of the first pair of flip-flops shifting the binary signal stored in the one of the pair of latches fed thereto in response to one of the edges of each one of the clock pulses, another one of the first pair of flip-flops shifting the binary signal stored in the another one of the pair of latches fed thereto in response to one of the edges of each one of the clock pulses;

(iv) a lock-out circuit for preventing subsequent production of the control signal until a subsequently detected edge occurs during a second, different pair of the sequential phases of the four phases of the clock pulses, such lock-out circuit comprising a second pair of logic gates coupled to outputs of the pair of latches and responsive to a block/unblock control signal, such block/unblock control signal being in an unblock condition when a detected edge occurs during the second, different pair of the sequential phases of the four phases of the clock pulses and for producing a block condition when a pair of successive detected edges occur in the first pair of sequential phases of the four phases of the clock pulses;

(v) a second pair of flip-flops fed by the second pair of logic gates, each one of the second pair of flip-flops being fed by a corresponding one of the first pair of flip-flops and by the clock pulses produced by the voltage controlled oscillator, one of the second pair of flip-flops shifting the binary signal stored in one of the first pair of flip-flops fed thereto in response to one of the edges of each one of the clock pulses during the unblock condition and being inhibited from such shifting by the lock-out circuit during the block condition, another one of the second pair of flip-flops shifting the binary signal stored in another one of the first pair of flip-flops fed thereto in response to one of the edges of each one of the clock pulses during the unblock condition and being inhibited from such shifting by the lock-out circuit during the block condition;

and wherein the outputs of the second pair of flip-flops are used to generate signal.

5. A frequency detection system for producing clock pulses having a frequency equal to the frequency of a stream of binary data, comprising:

(A) a charge pump;

(B) a voltage controlled oscillator, for producing an in-phase clock pulse, CKI, and a quadrature clock pulse, CKQ, shifted in time from the in-phase clock pulse one quarter of a clock pulse period, each clock pulse period being separated into four sequential phases a first phase occurring when the in-phase clock pulse is at a first state and the quadrature clock pulse is in a second state, a second phase occurring when the in-phase clock pulse is in the first state and the quadrature clock pulse is in the first state, a third phase occurring when the in-phase clock pulse is in the second state and the quadrature clock pulse is in the first state, and a fourth phase occurring when the in-phase clock pulse is in the second state and the quadrature clock pulse is in the second state, the first, second, third and fourth phases being separated by first, second, third and fourth boundaries, respectively, the clock pulses, CKI and CKQ, having a frequency which changes in accordance with an output signal produced by the charge pump;

(C) a frequency detector fed detected edges of the stream of binary data and the in-phase and quadrature clock pulses, such frequency detector comprising:

(i) a first pair of logic gates fed by the in-phase and quadrature clock pulses, one of such gates producing a logic signal having a logic state indicating, when a detected edge occurs during one of a first pair of sequential phases of the phases of the clock pulses and another one of the first pair of logic gates producing a logic signal having the logic state indicating when a detected edge occurs during the other one of the first pair of sequential phases of the four phases of the clock pulses the first pair of sequential phases of the four phases of the clock pulses occurring when one of the in-phase and quadrature clock pulses is in the first state and the other one of the in-phase and quadrature clock pulses is in the second state during one portion of the clock pulse period and changes the logic state during a succeeding portion of the clock pulse period;

(ii) a pair of latches each one thereof being fed by a corresponding one of the first pair of logic gates and the detected edges of the stream of binary data, one of such latches storing a binary signal indicating when a detected edge occurs during one of the first pair of sequential phases of the four phases of the clock pulses and another one of the latches producing a binary signal indicating when a detected edge occurs during the other one of the first pair of sequential phases of the four phases of the clock pulses;

(iii) a first pair of flip-flops, each one being fed by a corresponding one of the pair of latches and by the clock pulses produced by the voltage controlled oscillator, one of the first pair of flip-flops shifting the binary signal stored in the one of the pair of latches fed thereto in response to one of the edges of each one of the clock pulses, another one of the first pair of flip-flops shifting the binary signal stored in the another one of the pair of latches fed thereto in response to one of the edges of each one of the clock pulses;

(iv) a lock-out circuit for preventing subsequent production of the control signal until a subsequently detected edge occurs during a second, different pair of the sequential phase of the four phases of the clock pulses, such lock-out circuit comprising a second pair of logic gates coupled to outputs of the first pair of flip-flops and responsive to a block/unblock control signal, such block/unblock control signal being in an unblock condition when a detected edge occur during a second, different pair of the sequential phases of the four phases of the clock pulses and for producing a block condition when a pair of successive detected edges occur in the first pair of sequential phases of the four phases of the clock pulses;

(v) a second pair of flip-flops fed by the second pair of logic gates, each one of the second pair of flip-flops being fed by a corresponding one of the first pair of flip-flops and by the clock pulses produced by the voltage controlled oscillator, one of the second pair of flip-flops shifting the binary signal stored in one of the first pair of flip-flops fed thereto in response to one of the edges of each one of the clock pulses during the unblock condition and being inhibited from such shifting by the lock-out circuit during the block condition, another one of the second pair of flip-flops shifting the binary signal stored in another one of the first pair of flip-flops fed thereto in response to one of the edges of each one of the clock pulses during the unblock condition and being inhibited from such shifting by the lock-but circuit during the block condition;

and wherein the outputs of the second pair of flip-flops are fed to the charge pump as pump-up and pump-down signals.

* * * * *